(12) United States Patent
Pease et al.

(10) Patent No.: US 9,859,097 B2
(45) Date of Patent: Jan. 2, 2018

(54) VACUUM TUBE ELECTRON MICROSCOPE

(71) Applicant: The Board of Trustees of the Leland Stanford Junior University, Palo Alto, CA (US)

(72) Inventors: R. Fabian W. Pease, Stanford, CA (US); Manu Prakash, San Francisco, CA (US); James Stanley Cybulski, Stanford, CA (US); Alireza Nojeh, Vancouver (CA)

(73) Assignees: The Board of Trustees of the Leland Stanford Junior University, Palo Alto, CA (US); The University of British Columbia, Vancouver, British Columbia ( * ) Notice: Subject to any disclaimer, the term of this patent is extended or adjusted under 35 U.S.C. 154(b) by 0 days.

(21) Appl. No.: 15/224,167

(22) Filed: Jul. 29, 2016

(65) Prior Publication Data
US 2017/0062179 A1  Mar. 2, 2017

Related U.S. Application Data

(60) Provisional application No. 62/212,728, filed on Sep. 1, 2015.

(51) Int. Cl.
  *H01J 37/26* (2006.01)
  *H01J 37/28* (2006.01)
(52) U.S. Cl.
  CPC ........... *H01J 37/28* (2013.01); *H01J 2237/14* (2013.01); *H01J 2237/18* (2013.01); *H01J 2237/28* (2013.01)

(58) Field of Classification Search
  USPC .................................. 250/306, 307, 310, 311
  See application file for complete search history.

(56) References Cited

U.S. PATENT DOCUMENTS

| | | | | |
|---|---|---|---|---|
| 2,422,943 A * | 6/1947 | Bachman | ................ | H01J 29/14 250/311 |
| 3,787,696 A | 1/1974 | Dao et al. | | |
| 3,814,356 A * | 6/1974 | Coleman | ................ | H01J 37/02 248/636 |
| 7,339,167 B2 | 3/2008 | Ohshima et al. | | |
| 7,906,762 B2 | 3/2011 | Bierhoff et al. | | |
| 8,492,716 B2 * | 7/2013 | Shachal | ................ | H01J 37/16 250/307 |
| 2005/0092929 A1 * | 5/2005 | Schneiker | ................ | G21K 1/08 250/396 R |
| 2007/0145267 A1 | 6/2007 | Adler et al. | | |

OTHER PUBLICATIONS

Green et al., "Atmospheric scanning electron microscopy using silicon nitride thin film windows", 1991, JVSTB v9 pp. 1557-1558.

* cited by examiner

*Primary Examiner* — Nicole Ippolito
(74) *Attorney, Agent, or Firm* — Lumen Patent Firm

(57) ABSTRACT

A permanently sealed vacuum tube is used to provide the electrons for an electron microscope. This advantageously allows use of low vacuum at the sample, which greatly simplifies the overall design of the system. There are two main variations. In the first variation, imaging is provided by mechanically scanning the sample. In the second variation, imaging is provided by point projection. In both cases, the electron beam is fixed and does not need to be scanned during operation of the microscope. This also greatly simplifies the overall system.

11 Claims, 5 Drawing Sheets

VACUUM TUBE ELECTRON MICROSCOPE

CROSS REFERENCE TO RELATED APPLICATIONS

This application claims the benefit of U.S. provisional patent application 62/212,728, filed on Sep. 1, 2015, and hereby incorporated by reference in its entirety.

FIELD OF THE INVENTION

This invention relates to electron microscopes.

BACKGROUND

The scanning electron microscope (SEM) has been in widespread use for many years as a general purpose high resolution imaging tool. However, SEMs remain expensive. For example, existing commercial SEMs typically cost at least $100,000. They feature demountable vacuum systems that require vacuum pumping systems that cost $5000 or more. They employ a series of highly stable power supplies for accelerating and focusing the electrons, and complex analog electronics for scanning the electron beam. Many also feature interchangeable apertures, multiple signal extraction modes, multiple electron lenses and cathodes that need replacing or rejuvenating from time to time. All of these characteristic features increase cost. Accordingly, it would be an advance in the art to provide a low cost electron microscope.

SUMMARY

In this work, a permanently sealed vacuum tube is used to provide the electrons for an electron microscope. This advantageously allows use of low vacuum at the sample, which greatly simplifies the overall design of the system. There are two main variations. In the first variation, imaging is provided by mechanically scanning the sample. In the second variation, imaging is provided by point projection. In both cases, the electron beam is fixed and does not need to be scanned during operation of the microscope. This also greatly simplifies the overall system. Here "permanently sealed" means that no pump is needed to maintain vacuum, as opposed to a "demountably sealed" vacuum enclosure which requires continual pumping.

Various applications can benefit from this technology. SEMs are the easiest microscope to use, have much greater magnification range than others, much better resolution and depth of focus than light microscopes, and negligible specimen preparation compared to that needed for TEM. The images usually represent surface topography in a manner similar to our everyday experience of viewing objects, hence can be intuitively interpreted. Decreasing cost will lead to more applications. Significant specific applications include:
1) Identification of bacteria and other organisms of interest to biologists and health care providers; and
2) Topographic studies of surfaces of any solid materials, even insulators given that the sample can be in a humid environment.

Significant advantages are provided. This electron microscope configuration eliminates the need for vacuum pumps by employing a sealed-off vacuum tube with a thin electron window. By placing the samples very close (e.g. 100 microns) to the window, the sample can be at atmospheric pressure or at a low, inexpensive vacuum (e.g. 10 Torr as opposed to a maximum of 0.0001 Torr for a conventional SEM system). The use of a sealed-off tube eliminates the formation of electron beam induced contamination that is an undesirable complication seen in demountable high vacuum systems.

These configurations can be regarded as 'pumpless' electron microscopes, since no vacuum pumps are needed to provide high vacuum where the electrons are generated and accelerated. The use of pumps in some embodiments to provide vacuum at the sample does not alter the basically 'pumpless' nature of these configurations, since the vacuum (if any) at the sample can be provide by low vacuum pumps that are much less complex and expensive than the high vacuum pumps commonly used in electron microscope systems.

Possible variations or modifications include:
1) Electronic scanning and stigmation with external coils placed, for example, between the pole faces of the magnetic lens;
2) Laser-pointer excited thermal or thermally- or field-assisted photoelectron emission;
3) Sub-200 nm diameter electron source realized, for example, by surface plasmon resonance; and
4) Providing a control electrode between the cathode and anode.

Significant features include:
A) Sealed-off tube with laser excited cathode and electron transparent window; all focusing, scanning and stigmation fields are excited by components external to the sealed-off vacuum tube.
B) The use of a sealed-off vacuum not only eliminates the need for a high vacuum pumping system but, through the use of gettering which is standard in vacuum tube practice, permits a larger range of cathodes than is normally possible in a demountable high-vacuum system.
C) Vacuum tubes with thermionic cathodes normally have a lifetime of many years.
D) Electron transparent window also acts as the aperture controlling the beam convergence angle.

DETAILED DESCRIPTION

Figure 1:
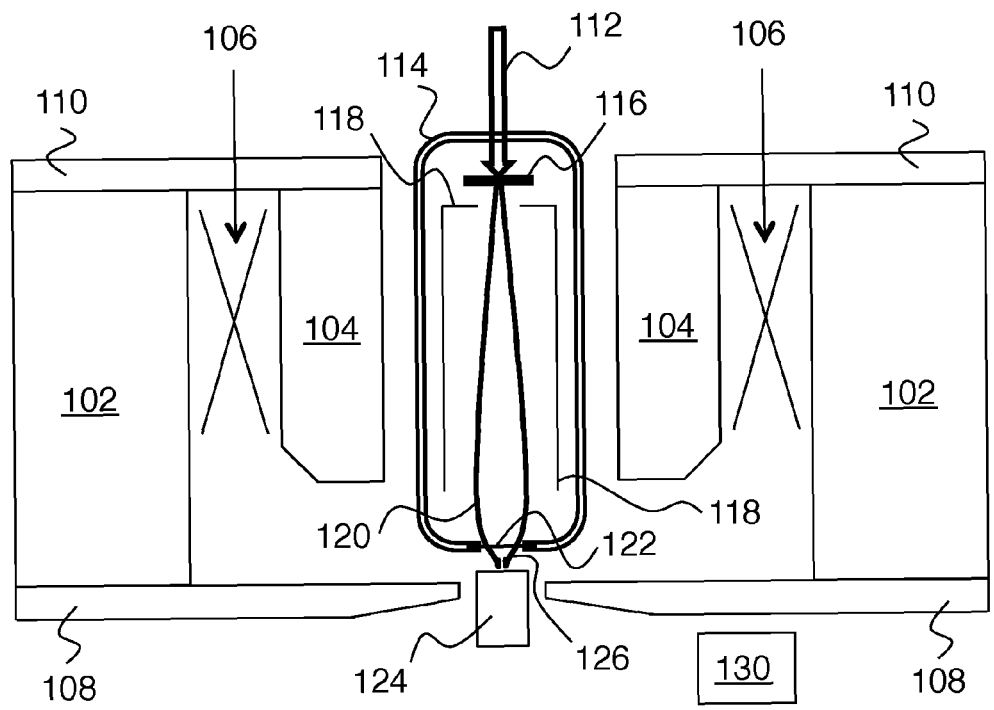
FIG. 1 shows a first embodiment of the invention having a mechanically scanned sample stage.

FIG. 1 shows a first embodiment of the invention having a mechanically scanned sample stage. In this example, a permanently sealed vacuum tube 114 having an internal pressure of less than about $10^{-9}$ Torr (preferably having an internal pressure of less than $10^{-10}$ Torr and even less, through the use of gettering for gases, such as hydrocarbons that lead to contamination and degradation of the cathode) includes a cathode 116 and an anode 118. Cathode 116 is configured to emit electrons responsive to an applied excitation. Preferably this excitation is illumination with a laser beam 112 (preferably focused to a spot of 1000 nm diameter or less), as shown, but any other means for producing electrons from the cathode can be employed (e.g., thermionic emission, field emission, etc.). Vacuum tube 114 can be fabricated of any material suitable for making permanently sealed vacuum tubes, such as glass, ceramics or metals. In some embodiments, the vacuum tube is glass having a silicon member embedded in its wall to provide the electron window.

Cathode 116 and anode 118 are configured to accelerate the electrons responsive to an applied electrical bias to provide accelerated electrons 120. For example, the anode can be grounded and the cathode biased to about −50 kV. Anode 118 is disposed within vacuum tube 114, e.g. as shown. The electrons can be accelerated using any high voltage source whose negative output is connected to the cathode and positive (ground) to the anode by metal connectors led through the wall of the vacuum tube 114 as is standard practice in vacuum tube technology. Preferably the voltage source is optimized for high voltage (e.g., 50 kV) and low current (e.g., 1 nA), which is expected to reduce the cost of the voltage source.

An electron-transparent window 122 is disposed in a wall of vacuum tube 114. Electron-transparent window 122 is configured to receive accelerated electrons 120 and to provide emitted electrons 126 to a sample disposed outside the vacuum tube. Here electron window 122 can be of any material that is suitably electron transparent and has sufficient mechanical strength to withstand the pressure difference between inside the vacuum tube and outside the vacuum tube. For example, a 10 nm thick film of diamond or boron nitride across a 2 micron diameter aperture is suitable. In this example, the sample is mounted on sample stage 124. An image of the sample is formed by mechanically scanning sample stage 124 and using the signal formed, for example by detecting the backscattered electrons reaching detectors 204, to control the intensity of each displayed pixel. A processor 130 can be configured to provide an image from signals provided by the sensor. In preferred embodiments, processor 130 is configured to correct distortions of the mechanical scanning. This advantageously allows the use of inexpensive mechanical scanners that may have non-ideal performance (e.g., nonlinear scan, hysteresis etc.). Such non-ideal performance can be compensated for with the processor. Scanning can be accomplished mechanically using, for example, micro cantilevers oscillating at the resonant frequency.

A magnetic lens is disposed around vacuum tube 114, where the magnetic lens is configured to focus emitted electrons 126 onto the sample. In this example, the magnetic lens includes permanent magnet 102 and auxiliary electromagnet 106 wound around a support member 104. Focusing of the emitted electrons onto the sample can be adjusted with auxiliary electromagnet 104. Top member 110 can be used to provide mechanical support for the magnetic lens. As is standard practice in magnetic electron lens design members 110, 102, 108 and 104 comprise the high permeability portions of the magnetic circuit to confine the focusing field region to bring about the finest focusing of the electron beam onto the sample.

Figure 2:
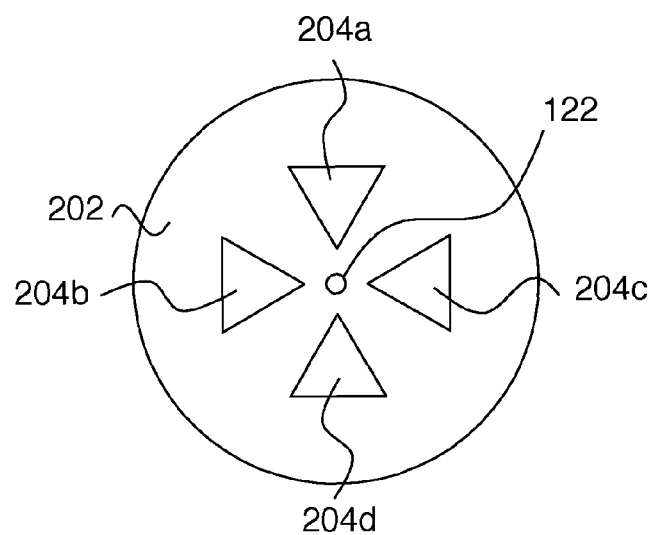
FIG. 2 shows a detailed view of the detectors and electron window in the embodiment of FIG. 1.

FIG. 2 shows a detailed view looking up from sample stage 124 on FIG. 1. Here 202 is a window support structure (e.g., a silicon wafer), and 204a, 204b, 204c, 204d together make up a quadrant detector for electrons. This arrangement provides a sensor configured to receive electrons from the sample responsive to illumination by emitted electrons 126.

Figure 3:
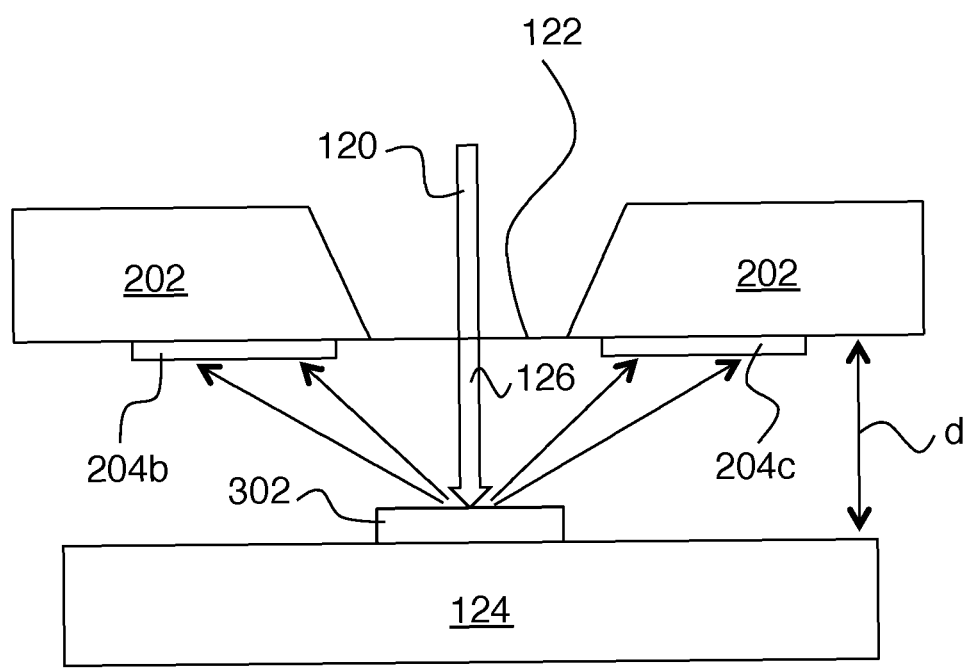
FIG. 3 schematically shows operation of the embodiment of FIG. 1.

FIG. 3 shows this operation in a side view. Here 302 is the sample. The outputs from the quadrant detector can be provided to signal amplifiers followed by analog to digital conversion as part of the processing used to provide the image. Here the sensor is configured to receive scattered electrons from the sample. Detection and imaging of backscattered electrons with a quadrant electron detector is known in the art. The convergence angle of emitted electrons at the sample (usually about 0.01 radians) can be set by the diameter of the window (e.g., 2 um) together with the working distance (e.g. 100 um) or by the angle of the (unapertured) beam after focusing.

An important feature of this work is that the sample need not be in a high vacuum. A modest vacuum (e.g., between 1 and 10 Torr) will suffice for a sample that is about 100 microns from the window aperture. If the sample is closer to the window aperture, the allowable pressure at the sample increases. In some cases it is expected to be able to perform this kind of microscopy with the sample at atmospheric pressure. The separation d on FIG. 3 is preferably less than the mean free path of electrons in the ambient pressure around the sample.

Figure 4:
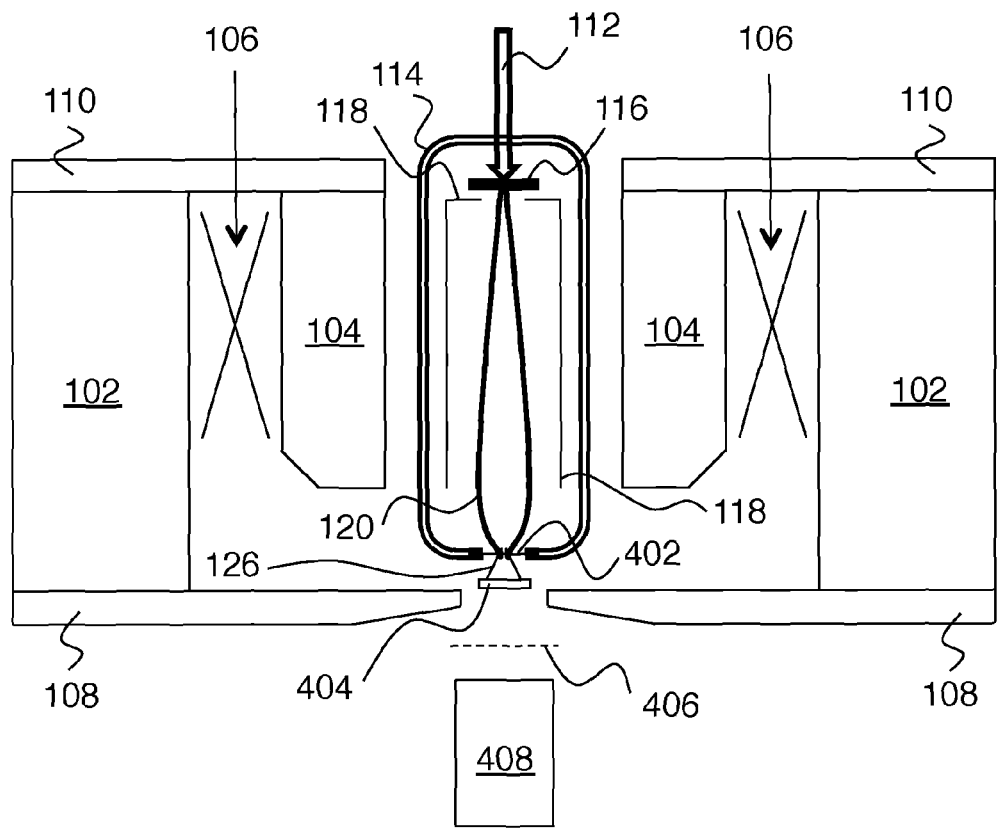
FIG. 4 shows a second embodiment of the invention having a projected image of the sample.

FIG. 4 shows a second embodiment of the invention where the image is formed by point projection as opposed to mechanically scanning the sample. This embodiment is similar to the embodiment of FIG. 1, except that the electron window 402 has different preferred design parameters, sample 404 needs to be prepared to provide an image by electron transmission, an electron image 406 is provided by point projection, and this image is captured with sensor 408.

Figure 5:
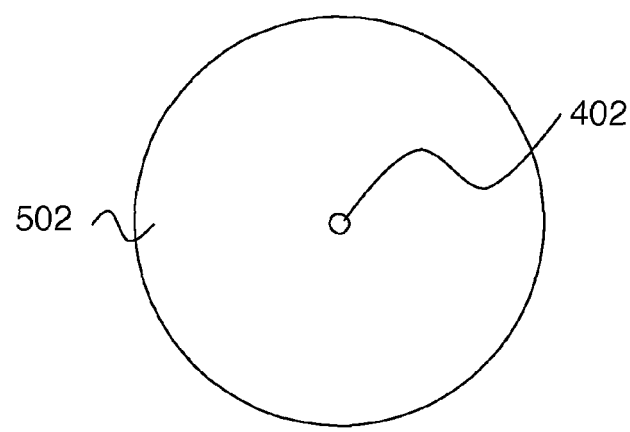
FIG. 5 shows a detailed view of the electron window in the embodiment of FIG. 4.
Figure 6:
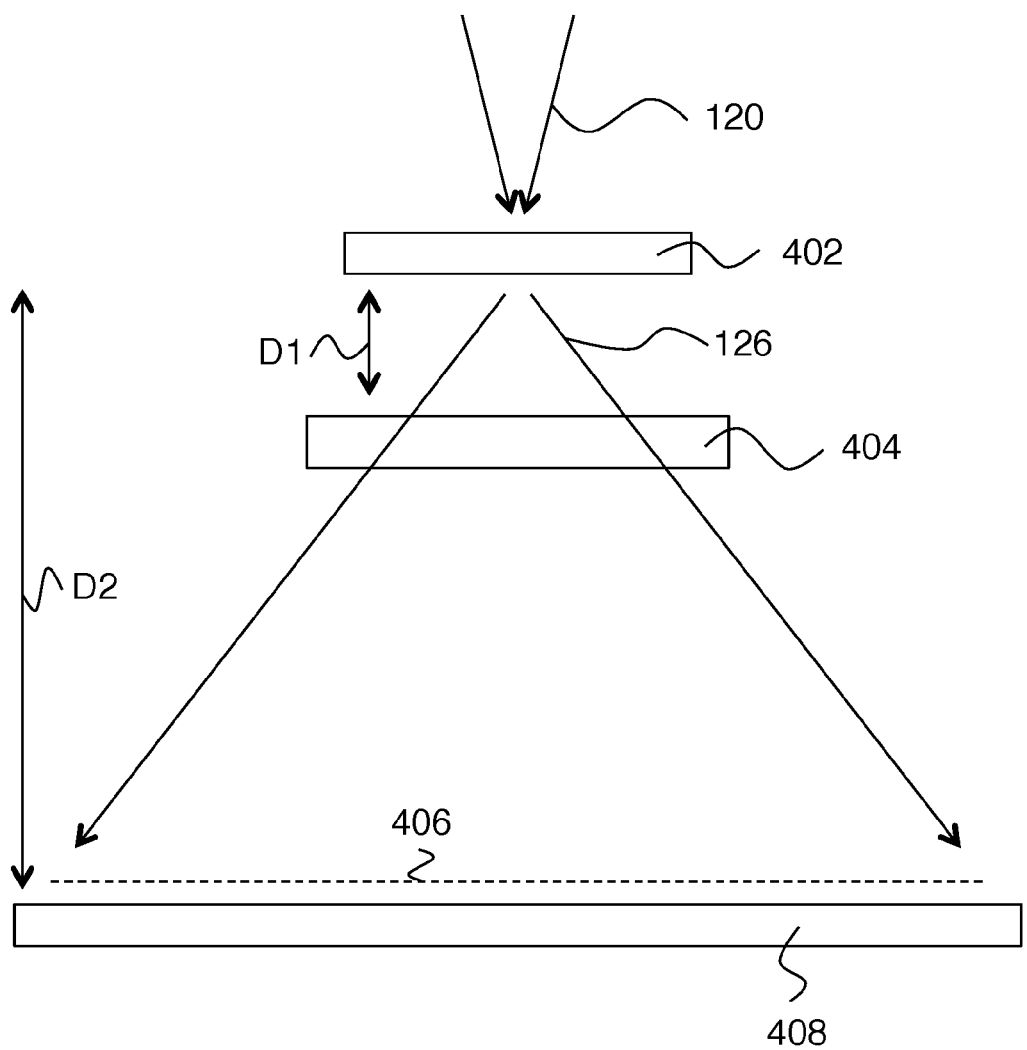
FIG. 6 schematically shows operation of the embodiment of FIG. 4.

FIG. 5 shows a detailed view looking up from sample 404 on FIG. 4. Here 402 is the electron window disposed in window support structure 502 (e.g., a silicon wafer). As indicated above, the design parameters for the electron window in this embodiment differ from those of the embodiment of FIG. 1. Here the goal is to provide a point source of electrons radiating at a large angle (e.g. up to 30 degrees) in the directions needed for the projection geometry. This can be accomplished either by employing a large angle of the focused beam or by having an electron translucent material in the window that scatters electrons appropriately. The first approach suffers from distortion caused by spherical aberration of the large-angle focusing. In the second, preferred, approach suitable windows can be high atomic number materials (e.g., Pt, Ta) having a thickness of 50-100 nm. FIG. 6 shows operation of this embodiment. The projective geometry provides a magnification of D2/D1 in projected image 406. As above, the sample need not be in a high vacuum. A pressure of 10 Torr or lower is suitable. The sample can be disposed 50-100 microns away from the electron window aperture. In one example, the electron image 406 is formed about 1 mm away from the sample. This image can be sensed directly using a high resolution electron image detector, such as a CMOS (complementary metal-oxide-semiconductor) or CCD (charge coupled device) detector. Alternatively, the electron image can be provided to a scintillator and the resulting optical image can be viewed with an optical microscope. Here the sensor is configured to receive transmitted electrons from the sample.

The differing angles shown for accelerated electrons 120 and for emitted electrons 126 on FIG. 6 are significant. In one design example, accelerated electrons 120 have a semi-angle of about 10 mrad while emitted electrons 126 have a semi-angle of about 100 mrad. The reason for this change in passage through window 402 is scattering of electrons in window 402, which is why this window is preferably electron-translucent and not electron-transparent for point projection embodiments.

Figure 7:
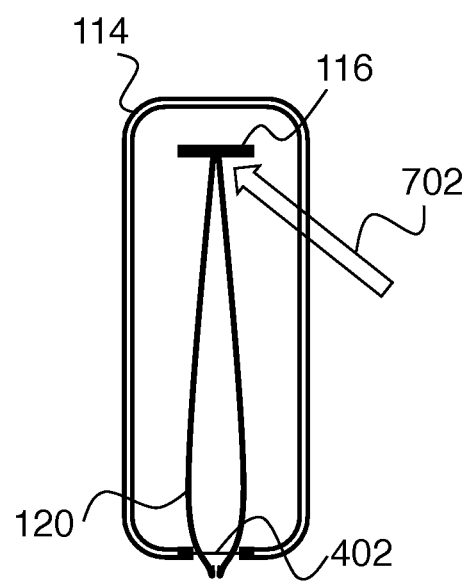
FIG. 7 shows an alternative cathode configuration for use in embodiments of the invention.

The preceding examples show illumination of the cathode in transmission. In other words, electrons are emitted from an emissive surface of the photocathode that is opposite a surface of the photocathode that is illuminated by the laser beam. FIG. 7 shows an alternative cathode configuration where electrons are emitted from an emissive surface of the photocathode 116 that is illuminated by laser beam 702.

The invention claimed is:

1. An electron microscope comprising:
  a permanently sealed vacuum tube having an internal gas pressure of less than about $10^{-9}$ Torr;
  a cathode disposed within the vacuum tube, wherein the cathode is configured to emit electrons responsive to an applied excitation;
  an anode disposed within the vacuum tube, wherein the anode and cathode are configured to accelerate the electrons responsive to an applied electrical bias to provide accelerated electrons;
  an electron-transparent window disposed in a wall of the vacuum tube, wherein the electron-transparent window is configured to receive the accelerated electrons and to provide emitted electrons to a sample disposed outside the vacuum tube;
  a magnetic lens disposed around the vacuum tube, wherein the magnetic lens is configured to focus the emitted electrons onto the sample; and
  a sensor configured to receive electrons from the sample responsive to illumination by the emitted electrons.

2. The electron microscope of claim 1, further comprising a sample stage configured to provide mechanical scanning of sample position, wherein the sensor is configured to receive scattered electrons from the sample.

3. The electron microscope of claim 2, wherein the sample is in an ambient having a pressure between about 1 Torr and about 760 Torr.

4. The electron microscope of claim 2, further comprising a processor configured to provide an image from signals provided by the sensor, wherein the processor is configured to correct distortions of the mechanical scanning.

5. The electron microscope of claim 1, further comprising a sample stage configured to provide a point projection image of the sample at the sensor, wherein the sensor is configured to receive transmitted electrons from the sample.

6. The electron microscope of claim 5, wherein the sample and sensor are in an ambient having a pressure between about 0.1 Torr and about 10 Torr.

7. The electron microscope of claim 1, wherein the cathode is a photocathode and wherein the applied excitation is illumination of the cathode with a laser beam.

8. The electron microscope of claim 7, wherein electrons are emitted from an emissive surface of the photocathode that is illuminated by the laser beam.

9. The electron microscope of claim 7, wherein electrons are emitted from an emissive surface of the photocathode that is opposite a surface of the photocathode that is illuminated by the laser beam.

10. The electron microscope of claim 1, wherein the magnetic lens comprises a permanent magnet.

11. The electron microscope of claim 8, wherein the magnetic lens further comprises an auxiliary electromagnet, whereby focusing of the emitted electrons onto the sample can be adjusted.

* * * * *